(12) United States Patent
Lee et al.

(10) Patent No.: US 8,049,269 B2
(45) Date of Patent: Nov. 1, 2011

(54) NON-VOLATILE MEMORY DEVICE AND METHOD OF MANUFACTURING THE SAME

(75) Inventors: Se-Hoon Lee, Seoul (KR); Kyu-Charn Park, Pyeongtaek-si (KR); Jeong-Dong Choe, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 919 days.

(21) Appl. No.: 11/898,266

(22) Filed: Sep. 11, 2007

(65) Prior Publication Data

US 2008/0061361 A1 Mar. 13, 2008

(30) Foreign Application Priority Data

Sep. 12, 2006 (KR) .................... 10-2006-0087953

(51) Int. Cl.
*H01L 29/792* (2006.01)
*H01L 29/788* (2006.01)
*H01L 21/336* (2006.01)
*H01L 21/8247* (2006.01)

(52) U.S. Cl. ............... 257/324; 257/316; 257/E29.309; 257/E21.423; 257/E21.679; 438/287

(58) Field of Classification Search .................. 257/316, 257/324, E21.423, E29.309, E21.679; 438/287
See application file for complete search history.

(56) References Cited

U.S. PATENT DOCUMENTS

2004/0262676 A1* 12/2004 Lee et al. ...................... 257/328
2005/0019993 A1* 1/2005 Lee et al. ...................... 438/157
2005/0145932 A1* 7/2005 Park et al. ..................... 257/328
2005/0227435 A1* 10/2005 Oh et al. ........................ 438/257
2005/0266638 A1* 12/2005 Cho et al. ...................... 438/257
2006/0118876 A1* 6/2006 Lee et al. ...................... 257/365
2008/0157172 A1* 7/2008 Lee ................................ 257/321

FOREIGN PATENT DOCUMENTS

| JP | 2003-332469 | | 11/2003 |
| KR | 10-0475081 | * | 2/2005 |
| KR | 1020060037722 | | 5/2006 |

* cited by examiner

*Primary Examiner* — Zandra Smith
*Assistant Examiner* — Jeremy Joy
(74) *Attorney, Agent, or Firm* — Harness, Dickey & Pierce, P.L.C.

(57) ABSTRACT

In a non-volatile memory device, active fin structures extending in a first direction may be formed on a substrate. A tunnel insulating layer may be formed on surfaces of the active fin structures and bottom surfaces of trenches that may be defined by the active fin structures. A charge trapping layer and a blocking layer may be sequentially formed on the tunnel insulating layer. A gate electrode structure may include first portions disposed over top surfaces of the active fin structures and second portions vertically spaced apart from portions of the charge trapping layer that may be disposed over the bottom surfaces of the trenches, and may extend in a second direction substantially perpendicular to the first direction. Thus, lateral electron diffusion may be reduced in the charge trapping layer, and thereby the data retention performance and/or reliability of the non-volatile memory device may be improved.

32 Claims, 12 Drawing Sheets

NON-VOLATILE MEMORY DEVICE AND METHOD OF MANUFACTURING THE SAME

This U.S. non-provisional patent application claims priority under 35 USC §119 to Korean Patent Application No. 10-2006-0087953 filed on Sep. 12, 2006, in the Korean Intellectual Property Office (KIPO) the entire contents of which are incorporated herein by reference.

BACKGROUND

1. Technical Field

Example embodiments relate to a non-volatile memory device and a method of manufacturing the non-volatile memory device such as, a non-volatile memory device including a charge trapping layer.

2. Description of the Related Art

Semiconductor memory devices, in general, may be classified as either volatile or non-volatile semiconductor memory devices. Volatile semiconductor memory devices such as dynamic random access memory (DRAM) devices and/or static random access memory (SRAM) devices may have a relatively high response speed. However, volatile semiconductor memory devices may lose stored data when power is lost. Although non-volatile semiconductor memory devices, such as electrically erasable programmable read only memory (EEPROM) devices and/or flash memory devices, may have a relatively slow response speed, such devices may maintain stored data even when power is lost.

In EEPROM devices, data may be electronically stored, e.g., programmed, or erased through a Fowler-Nordheim (F-N) tunneling mechanism and/or a channel hot electron injection mechanism. The flash memory device may be classified as either a floating gate type or a charge trap type, such as silicon oxide nitride oxide semiconductor (SONOS) type devices and/or metal oxide nitride oxide semiconductor (MONOS) type devices.

A SONOS or MONOS type non-volatile memory device may include a tunnel insulating layer formed on a channel region of a semiconductor substrate, a charge trapping layer for trapping electrons from the channel region, a blocking layer formed on the charge trapping layer, a gate electrode formed on the blocking layer, spacers formed on sidewalls of the gate electrode and/or source/drain regions formed at surface portions of the semiconductor substrate adjacent to the channel region.

FIG. 1 is a cross-sectional view taken along a word line of a conventional non-volatile memory device, and FIG. 2 is a cross-sectional view taken in a direction substantially perpendicular to the word line of the conventional non-volatile memory device.

Referring to FIGS. 1 and 2, a conventional non-volatile memory device 1 may include field insulating patterns 12 formed at surface portions of a semiconductor substrate 10 to define active regions 10a.

The conventional non-volatile memory device 1 may further include a plurality of memory cells 1a and 1b. Word lines 20 may extend on the semiconductor substrate 10 in a direction substantially perpendicular to an extending direction of the active regions 10a. A tunnel insulating layer 14, a charge trapping layer 16 and a blocking layer 18 may be disposed between the semiconductor substrate 10 and each of the word lines 20. That is, a plurality of gate structures 22 may be disposed on the semiconductor substrate 10, which may include the tunnel insulating layer 14, the charge trapping layer 16, the blocking layer 18 and the word line 20, and may extend in a word line direction. Source/drain regions 24 may be formed at surface portions of the active regions 10a adjacent to the gate structures 22, and channel regions 10b may be positioned underneath the gate structures 22.

The memory cells 1a and 1b may be disposed on the active regions 10a, and the memory cells 1a and 1b may be programmed or erased by applying a programming or erasing voltage to the word line 20 serving as gate electrodes. When a programming voltage is applied to the word line 20, electrons are trapped in trap sites of the charge trapping layer 16 from the channel region 10b through the tunnel insulating layer 14, and thus one bit of data may be stored in the charge trapping layer 14. When an erasing voltage is applied to the word line 20, electrons may be discharged from the charge trapping layer 16 into the channel region 10b through the tunnel insulating layer 14, and thus the stored data in the charge trapping layer 14 may be erased.

Each of the memory cells 1a and 1b may be used as a multi-level cell (MLC) to increase the data storage capacity of the non-volatile memory device 1. When either of the memory cells 1a and 1b is used as the MLC, it may be desirable to form the charge trapping layer 16 using a material having a high trap density. The high trap density of the charge trapping layer 16 may cause lateral charge diffusion in the charge trapping layer 16. For example, when a memory cell 1a is programmed and an adjacent cell 1b is erased, electrons 26 trapped in the charge trapping layer 16 may move from the programmed memory cell 1a towards the erased memory cell 1b, as shown in FIG. 1.

As a result of the migration of electrons, the lateral charge diffusion in the charge trapping layer 16 may deteriorate data retention performance and also deteriorate the reliability of the non-volatile memory device 1. When a reading voltage is applied to the word line 20 to read the data stored in the programmed memory cell 1a, lateral charge diffusion may be accelerated.

SUMMARY

Example embodiments relate to a non-volatile memory device, for example, a non-volatile memory device having a reduced lateral charge diffusion.

Example embodiments also provide a method of manufacturing a non-volatile memory device that may be capable of reducing the lateral charge diffusion.

In example embodiments, a non-volatile memory device may include active fin structures extending in a first direction on a substrate; a tunnel insulating layer disposed on surfaces of the active fin structures and on bottom surfaces of trenches that are defined by the active fin structures; a charge trapping layer disposed on the tunnel insulating layer; a blocking layer disposed on the charge trapping layer; and a gate electrode structure including first portions disposed over top surfaces of the active fin structures and second portions vertically separated from portions of the charge trapping layer that may be disposed over the bottom surfaces of the trenches. The gate electrode structure may extend in a second direction substantially perpendicular to the first direction.

According to example embodiments, field insulating patterns may be disposed between the portions of the charge trapping layer that are disposed over the bottom surfaces of the trenches and the second portions of the gate electrode structure. Upper surfaces of the field insulating patterns may be disposed lower than the top surfaces of the active fin structures.

According to example embodiments, the blocking layer may be formed on the field insulating patterns, and on portions of the charge trapping layer that are disposed over surfaces of upper portions of the active fin structures.

According to example embodiments, the blocking layer may be formed on the charge trapping layer.

According to example embodiments, upper surfaces of the field insulating patterns may be substantially level with the upper surfaces of the portions of the charge trapping layer that are disposed over the top surfaces of the active fin structures. The blocking layer may be formed on the field insulating patterns and the portions of the charge trapping layer that are disposed over the top surfaces of the active fin structures.

According to example embodiments, upper surfaces of the field insulating patterns may be substantially level with the upper surfaces of the portions of the blocking layer that are disposed over the top surfaces of the active fin structures. The blocking layer may be formed on the charge trapping layer.

According to example embodiments, first field insulating patterns may be disposed on the substrate such that the trenches are defined by the sidewalls of the active fin structures the upper surfaces of the first field insulating patterns.

According to example embodiments, second field insulating patterns may be disposed between the portions of the charge trapping layer that are disposed over the bottom surfaces of the trenches and the second portions of the gate electrode structure. Upper surfaces of the second field insulating patterns may be disposed lower than the top surfaces of the active fin structures. The blocking layer may be formed on the charge trapping layer.

According to example embodiments, the blocking layer may be formed on the second field insulating patterns and the portions of the charge trapping layer that are disposed over the surfaces of the upper portions of the active fin structures.

According to example embodiments, upper surfaces of the second field insulating patterns may be substantially level with the upper surfaces of the portions of the charge trapping layer that are disposed over the top surfaces of the active fin structures. The blocking layer may be formed on the second field insulating patterns and the portions of the charge trapping layer that are disposed over the top surfaces of the active fin structures.

According to example embodiments, the upper surfaces of the second field insulating patterns may be substantially level with the upper surfaces of the portions of the blocking layer that are disposed over the top surfaces of the active fin structures. The blocking layer may be formed on the charge trapping layer.

In example embodiments, a method of manufacturing a non-volatile memory device may include forming active fin structures extending in a first direction on a substrate. A tunnel insulating layer may be formed on the surfaces of the active fin structures and the bottom surfaces of trenches defined by the active fin structures. A charge trapping layer may be formed on the tunnel insulating layer, and a blocking layer may be formed on the charge trapping layer. A gate electrode structure may be formed on the blocking layer. The gate electrode structure may include first portions disposed over top surfaces of the active fin structures and second portions vertically spaced apart from the portions of the charge trapping layer that are disposed over the bottom surfaces of the trenches, and may extend in a second direction substantially perpendicular to the first direction.

According to example embodiments, field insulating patterns may be formed between the portions of the charge trapping layer that are disposed over the bottom surfaces of the trenches and the second portions of the gate electrode structure.

According to example embodiments, a field insulating layer may be formed on the substrate to fill at least a portion of the trenches after the charge trapping layer is formed, and an upper portion of the field insulating layer may be etched away to expose portions of the charge trapping layer that are formed over surfaces of upper portions of the active fin structures. The blocking layer may be formed on the field insulating patterns and the exposed portions of the charge trapping layer.

According to example embodiments, the blocking layer may be formed on the charge trapping layer. A field insulating layer may be formed on the substrate to fill at least a portion of the trenches after the blocking layer is formed, and an upper portion of the field insulating layer may be etched away to expose portions of the blocking layer that are formed over surfaces of upper portions of the active fin structures.

According to example embodiments, a field insulating layer may be formed to fill at least a portion of the trenches on the substrate after the charge trapping layer is formed, and an upper portion of the field insulating layer may be etched away to expose upper surfaces of portions of the charge trapping layer that are formed over the top surfaces of the active fin structures. The blocking layer may be formed on the field insulating patterns and the exposed upper surfaces of the portions of the charge trapping layer.

According to example embodiments, the blocking layer may be formed on the charge trapping layer. A field insulating layer may be formed to fill at least a portion of the trenches on the substrate after the blocking layer is formed, and an upper portion of the field insulating layer may then be etched away to expose upper surfaces of the portions of the blocking layer that are formed over the top surfaces of the active fin structures.

According to example embodiments, first field insulating patterns may be formed on the substrate so that the trenches are defined by sidewalls of the active fin structures and upper surfaces of the first field insulating patterns.

According to example embodiments, second field insulating patterns may be formed between the portions of the charge trapping layer that are disposed over the bottom surfaces of the trenches (or the upper surfaces of the first field insulating patterns) and the second portions of the gate electrode structure.

According to example embodiments, a field insulating layer may be formed to fill at least a portion of the trenches on the substrate after the charge trapping layer is formed, and an upper portion of the field insulating layer may be etched away to expose portions of the charge trapping layer that are formed over surfaces of upper portions of the active fin structures. The blocking layer may be formed on the second field insulating patterns and the exposed portions of the charge trapping layer.

According to example embodiments, the blocking layer may be formed on the charge trapping layer. A field insulating layer may be formed to fill at least a portion of the trenches on the substrate after the blocking layer is formed, and an upper portion of the field insulating layer may be etched away to expose portions of the blocking layer that are formed over surfaces of upper portions of the active fin structures.

According to example embodiments, a field insulating layer may be formed to fill at least a portion of the trenches on the substrate after the charge trapping layer is formed, and an upper portion of the field insulating layer may then be etched away to expose upper surfaces of portions of the charge trapping layer that are formed over the top surfaces of the active fin structures. The blocking layer may be formed on the second field insulating patterns and the exposed upper surfaces of the portions of the charge trapping layer.

According to example embodiments, the blocking layer may be formed on the charge trapping layer. A field insulating layer may be formed to fill at least a portion of the trenches on the substrate after the blocking layer is formed, and an upper portion of the field insulating layer may be etched away to expose upper surfaces of portions of the blocking layer that are formed over the top surfaces of the active fin structures.

In accordance with example embodiments, because the field insulating patterns and/or the second field insulating patterns may be disposed between the charge trapping layer and the second portions of the gate electrode structure, the length of the charge trapping layer may be increased. Thus, the lateral diffusion of electrons trapped in the charge trapping layer may be reduced, and the data retention performance and reliability of the non-volatile memory device may be improved.

BRIEF DESCRIPTION OF THE DRAWINGS

Example embodiments will be described with reference to the following figures, wherein like reference numerals refer to like parts throughout the various figures unless otherwise specified. In the figures.

DESCRIPTION OF EXAMPLE EMBODIMENTS

Figure 1:
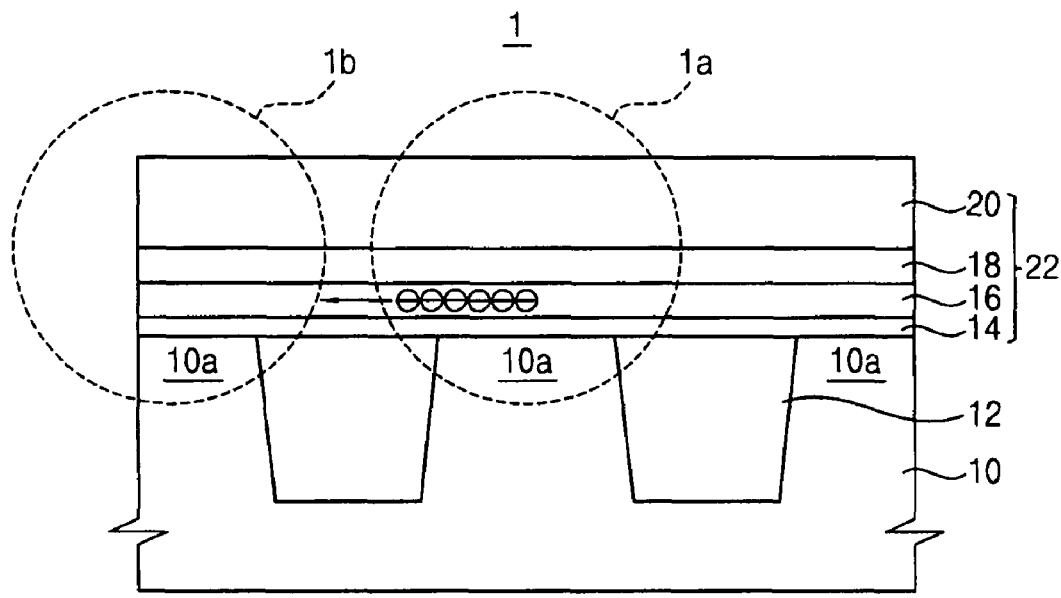
FIG. 1 is a cross-sectional view taken along a word line of a conventional non-volatile memory device.
Figure 2:
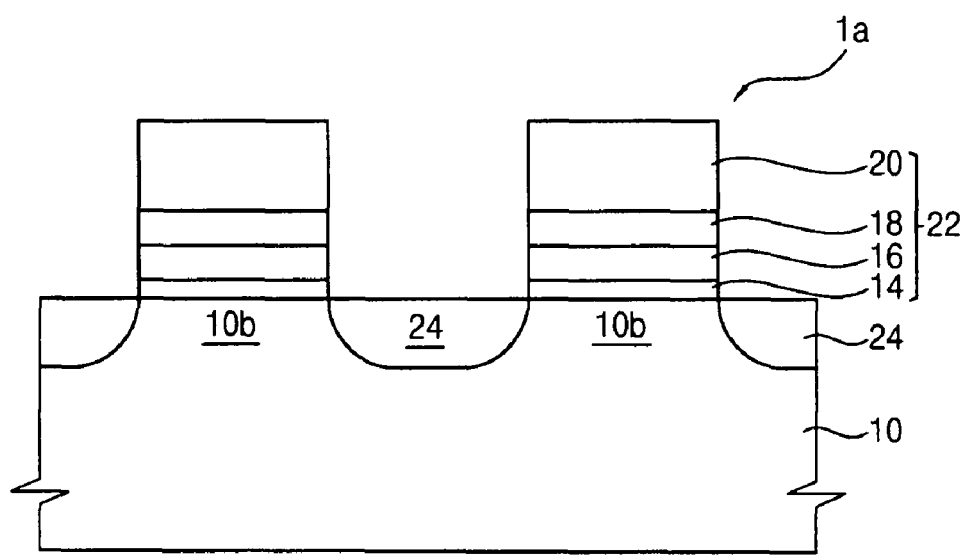
FIG. 2 is a cross-sectional view taken in a direction substantially perpendicular to the word line of the conventional non-volatile memory device of FIG. 1.

Example embodiments will now be described more fully with reference to the accompanying drawings. Although example embodiments are shown, these example embodiments should not be construed as being limiting. Rather, these example embodiments are provided so that this disclosure will be thorough and complete, and will fully convey the subject matter described herein to those skilled in the art. Like reference numerals refer to like elements throughout.

It will be understood that when an element is referred to as being "on" another element, the element may be directly on the other element, or intervening elements may be present. In contrast, when an element is referred to as being "directly on" another element, there are no intervening elements present. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments are described herein with reference to cross section illustrations that are schematic illustrations of idealized example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the example embodiments.

FIGS. 3 to 10 are cross-sectional views illustrating an example method of manufacturing a non-volatile memory device in accordance with an example embodiment.

Figure 3:
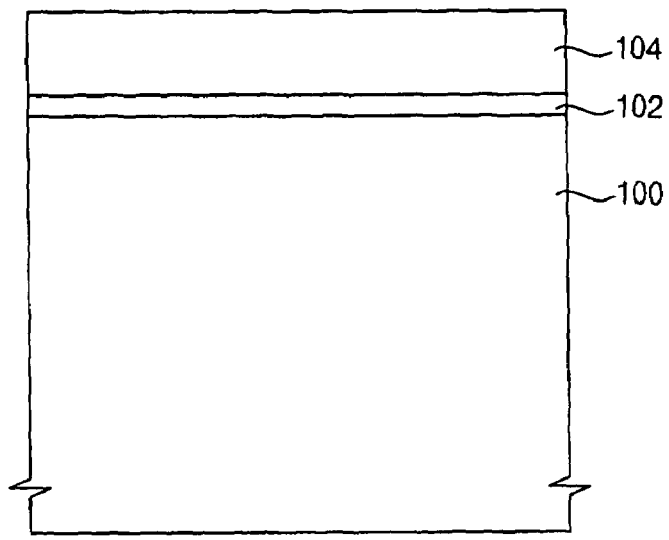
FIGS. 3 to 10 are cross-sectional views illustrating a method of manufacturing a non-volatile memory device in accordance with an example embodiment.

Referring to FIG. 3, a pad oxide layer 102 may be formed on a semiconductor substrate 100 such as a silicon wafer, and a mask layer 104 may be formed on the pad oxide layer 102.

The pad oxide layer 102 may be formed to a thickness of about 70 Å to about 100 Å by, for example, a thermal oxidation process and/or a chemical vapor deposition (CVD) process. The pad oxide layer 102 may be formed at a temperature of about 750° C. to about 900° C. for a surface treatment of the semiconductor substrate 100.

The mask layer 104 may include silicon nitride and may be formed to a thickness of about 1500 Å by, for example, a low pressure chemical vapor deposition (LPCVD) process and/or a plasma-enhanced chemical vapor deposition (PECVD) process using reactive gases such as dichlorosilane ($SiH_2Cl_2$), silane ($SiH_4$), ammonia ($NH_3$), nitrogen ($N_2$), and the like.

Figure 4:
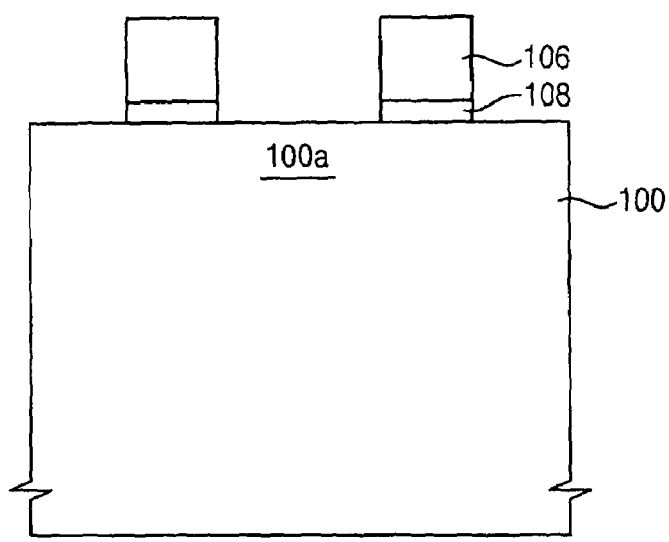

Referring to FIG. 4, a photoresist pattern may be formed on the mask layer 104 by a photolithography process, for example, to expose surface portions of the mask layer 104. The mask layer 104 and the pad oxide layer 102 may be sequentially patterned to form a mask pattern 106 and a pad oxide pattern 108, respectively, on the semiconductor substrate 100 by an etching process using the photoresist pattern as an etching mask. An isolation region 100a of the semiconductor substrate 100 may be exposed by the mask pattern 106 and the pad oxide pattern 108. The photoresist pattern may be removed, for example, by an ashing process and/or a stripping process after the mask pattern 106 and the pad oxide pattern 108 are formed.

Figure 5:
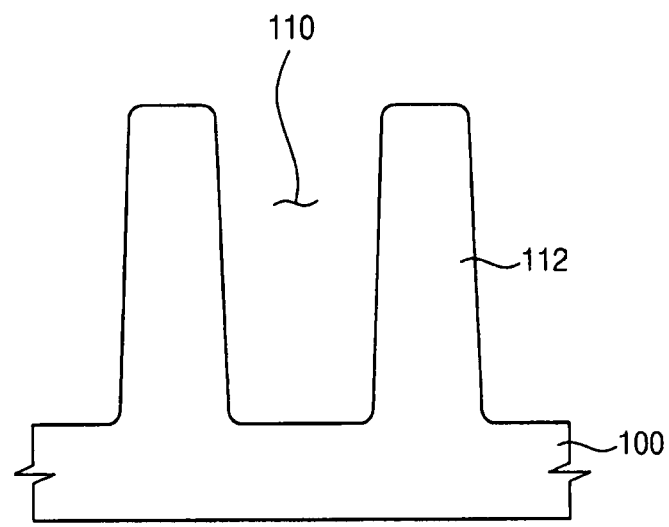

Referring to FIG. 5, an etching process using the mask pattern 106 as an etching mask may be performed to etch the isolation region 100a of the semiconductor substrate 100, to form trenches 110 which may extend in a first direction across the semiconductor substrate 100. The trenches 110 may be formed to a depth of about 1000 Å to about 5000 Å from a surface of the semiconductor substrate 100.

After the trenches 110 are formed, the mask pattern 106 and the pad oxide pattern 108 may be removed to thereby form active fin structures 112, which may extend in the first direction and may be defined by the trenches 110. The mask pattern 106 may be removed by an etchant including, for example, phosphoric acid ($H_3PO_4$) and water ($H_2O$). The pad oxide pattern 108 may be removed by an etchant including, for example, hydrogen fluoride (HF) and water ($H_2O$).

The active fin structures 112 may be used as channel regions and/or source/drain regions of memory cells. In example embodiments, the source/drain regions may be formed at portions of the active fin structures 112 by a subsequent impurity doping process, and the channel regions may be positioned between the source/drain regions.

Figure 6:
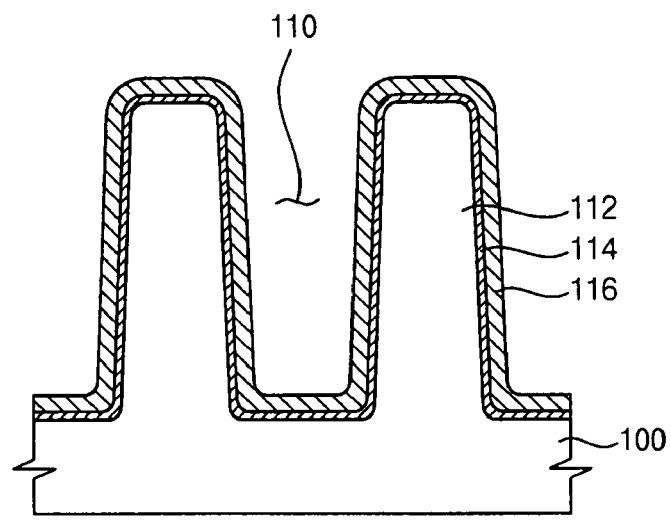

Referring to FIG. 6, a tunnel insulating layer 114 may be formed on surfaces of the active fin structures 112 and bottom surfaces of the trenches 110. The tunnel insulating layer 114 may include silicon oxide, and may be formed to a thickness of about 20 Å to about 80 Å by a thermal oxidation process. For example, the tunnel insulating layer 114 may be continuously formed to a thickness of about 35 Å along the surfaces of the active fin structures 112 and the bottom surfaces of the trenches 110. Alternatively, the tunnel insulating layer 114 may include a high-k material having a dielectric constant higher than that of silicon oxide, and the high-k material may be formed by a CVD process and/or an atomic layer deposition (ALD) process, for example.

A charge trapping layer 116 may be formed on the tunnel insulating layer 114. The charge trapping layer 116 may be formed to a thickness of about 20 Å to about 120 Å along surfaces of the tunnel insulating layer 114. The charge trapping layer 116 may include silicon nitride and may be formed by an LPCVD process, for example.

In accordance with another example embodiment, the charge trapping layer 116 may include a high-k material having a dielectric constant higher than that of silicon nitride. Examples of a high-k material that may be used for the charge trapping layer 116 may include metal oxide, metal oxynitride, metal silicon oxide, metal silicon oxynitride, and the like. Examples of a metal that may be used for the charge trapping layer 116 may include hafnium (Hf), zirconium (Zr), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), aluminum (Al), and the like. These items may be used alone or in combination.

Figure 7:
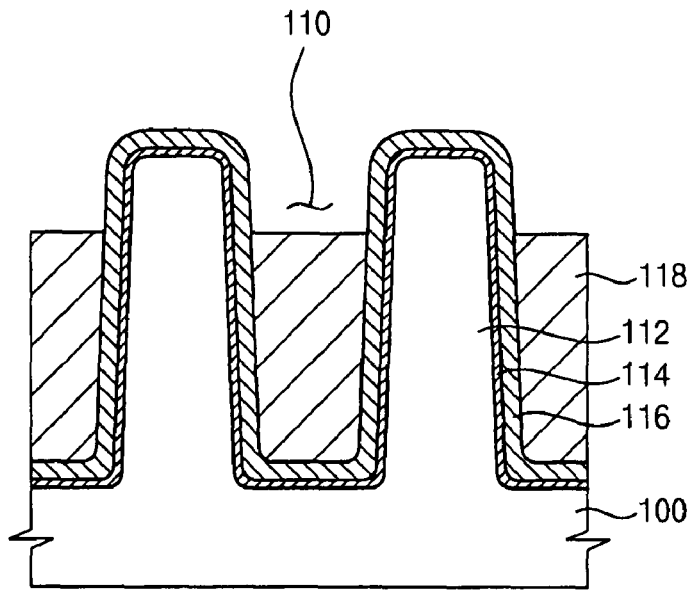

Referring to FIG. 7, a field insulating layer (not shown) may be formed on the semiconductor substrate 100 to fill at least a portion of the trenches 110. A silicon oxide layer, e.g., undoped silicate glass (USG), tetra-ethyl-ortho-silicate (TEOS), high-density plasma (HDP) oxide, and the like, may be used as the field insulating layer. For example, the field insulating layer may be formed by a high-density plasma chemical vapor deposition (HDP-CVD) process using a source gas including silane ($SiH_4$), oxygen ($O_2$), argon (Ar), and/or the like.

After forming the field insulating layer, an upper portion of the field insulating layer may be removed to expose portions of the charge trapping layer 116 on upper portions of the active fin structures 112. As a result, field insulating patterns 118 may be formed in the trenches 110, which may have upper surfaces disposed lower than top surfaces of the active fin structures 112. The upper portion of the field insulating layer may be removed by a wet etching process and/or a chemical dry etching (CDE) process, for example. The wet etching process may be performed using an etching solution including hydrogen fluoride (HF) and water ($H_2O$); an etching solution, e.g., a standard cleaning 1 (SC1) solution, including ammonium hydroxide ($NH_4OH$), hydrogen peroxide ($H_2O_2$) and/or water ($H_2O$); an etching solution, e.g., a Limulus Amoebocyte Lysate (LAL) solution, including ammonium fluoride ($NH_4F$), hydrogen fluoride (HF) and/or water ($H_2O$); an etching solution including phosphoric acid ($H_3PO_4$) and water ($H_2O$), and/or the like. The chemical dry etching (CDE) process may be performed using an etching gas include hydrogen fluoride (HF) and water vapor ($H_2O$); an etching gas including tetrafluoromethane ($CF_4$) and/or oxygen ($O_2$), and/or the like.

Figure 8:
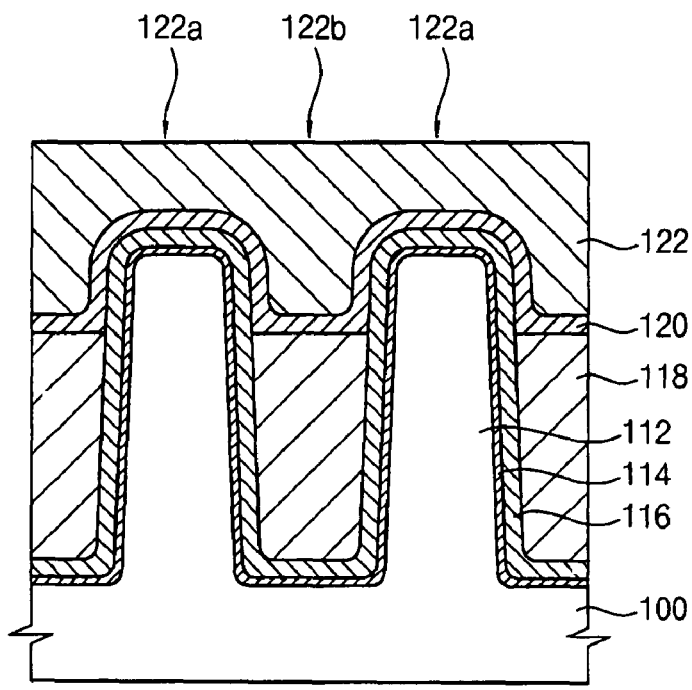

Referring to FIG. 8, a blocking layer 120 may be formed on the exposed portions of the charge trapping layer 116 and the field insulating patterns 118. The blocking layer 120 may be formed to provide electrical isolation between the charge trapping layer 116 and a gate electrode that may be subsequently formed.

The blocking layer 120 may include, for example, a high-k material having a dielectric constant higher than those of silicon oxide, silicon oxynitride and silicon nitride. Examples of the high-k material that may be used for the blocking layer 120 may include metal oxide, metal oxynitride, metal silicon oxide, metal silicon oxynitride, and the like, and may be formed by a CVD process, an ALD process and/or a physical vapor deposition (PVD) process. Examples of a metal that may be used for the blocking layer 120 may include hafnium (Hf), zirconium (Zr), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), aluminum (Al), and the like. These items may be used alone or in combination. For example, the blocking layer 120 may include aluminum oxide ($Al_2O_3$), and may be formed to a thickness of about 200 Å on the exposed portions of the charge trapping layer 116 and the field insulating patterns 118.

In an example embodiment, a first conductive layer, a barrier layer and a second conductive layer may be sequentially formed on the blocking layer 120.

Examples of the first conductive layer may include titanium (Ti), titanium nitride (TiN), tantalum (Ta), tantalum nitride (TaN), tungsten (W), tungsten nitride (WN), hafnium (Hf), niobium (Nb), molybdenum (Mo), molybdenum nitride ($MO_2N$), ruthenium oxide (RuO), ruthenium dioxide ($RuO_2$), iridium (Ir), iridium dioxide ($IrO_2$), platinum (Pt), cobalt (Co), chromium (Cr), titanium aluminide ($Ti_3Al$), titanium aluminum nitride ($Ti_2AlN$), palladium (Pd), tungsten silicide (WSi), nickel silicide (NiSi), cobalt silicide (CoSi), tantalum silicide (TaSi), and/or the like. These may be used alone or in combination. The first conductive layer may include, for example, tantalum nitride, and may be formed to a thickness of about 200 Å on the blocking layer 120.

The barrier layer formed on the blocking layer 120 may include metal nitride. For example, the barrier layer may include tungsten nitride and may be formed to a thickness of about 50 Å on the first conductive layer. Further, the barrier layer may serve as an adhesion layer between the first and second conductive layers.

The second conductive layer formed on the blocking layer 120 may include tungsten and may be formed to a thickness of about 300 Å on the barrier layer. Alternatively, the second conductive layer may include, for example, metal silicide and/or polysilicon doped with impurities. Examples of the metal silicide may include tungsten silicide, tantalum silicide, cobalt silicide, titanium silicide, and the like.

After forming the second conductive layer, a photoresist pattern may be formed on the second conductive layer. Then, an etching process using the photoresist pattern as an etching mask may be performed to thereby form gate electrode structures 122 (and/or word line structures) on the blocking layer 120, which may extend in a second direction substantially perpendicular to the first direction.

Figure 9:
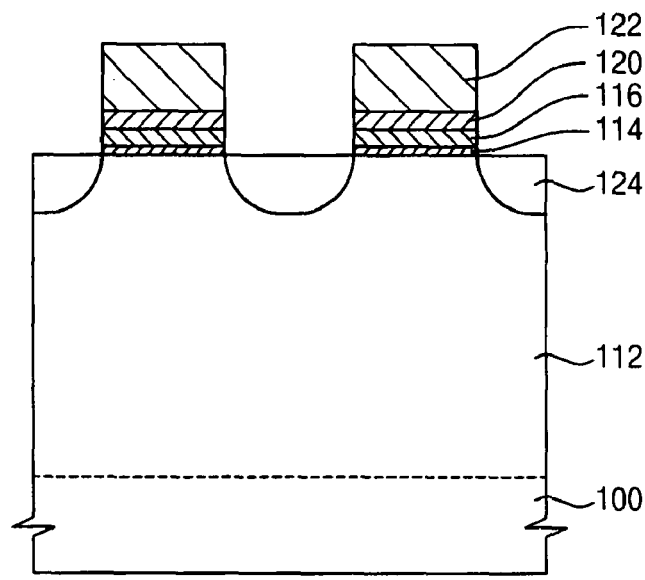
Figure 10:
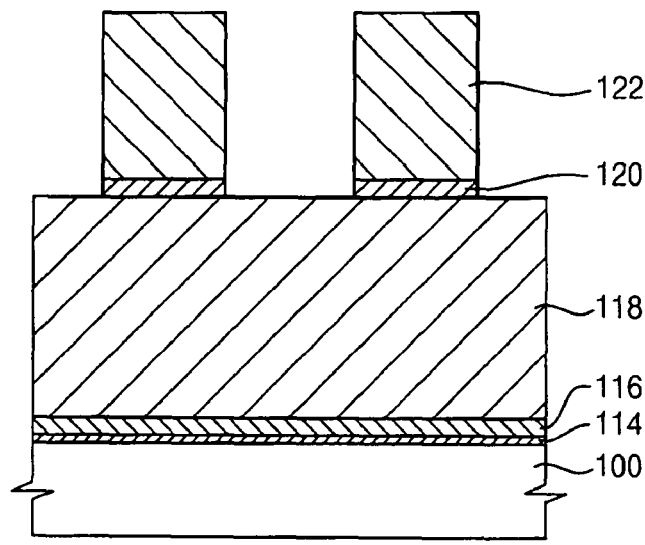

FIG. 9 is a cross-sectional view taken along an extending direction of the active fin structure 112, and FIG. 10 is a cross-sectional view taken along an extending direction of the field insulating pattern 118.

Referring to FIGS. 8 to 10, the etching process for forming the gate electrode structures 122 may be performed to expose surfaces of the upper portions of the active fin structures 112 and upper surfaces of the field insulating patterns 118. The upper portions of the field insulating patterns 118 may be partially removed during the etching process.

Although not shown in figures, each of the gate electrode structures 122 may include a first conductive layer pattern, a barrier layer pattern and a second conductive layer pattern. The first conductive layer pattern may serve as a gate electrode, and the second conductive layer pattern may serve as a word line.

The photoresist pattern may be removed, for example, by an ashing process and/or a stripping process after forming the gate electrode structures 122.

In accordance with another example embodiment, after forming the gate electrode structures 122, spacers (not shown) may be formed on sidewalls of the gate electrode structures 122. Then, the blocking layer 120, the charge trapping layer 116 and the tunnel insulating layer 114 may be patterned by an etching process using the spacers and the gate electrode structures 122 as etch masks so as to form gate structures.

Source/drain regions 124 may be formed at top surface portions of the active fin structures 112 adjacent to the gate electrode structures 122 to form a non-volatile memory device on the semiconductor substrate 100. The source/drain regions 124 may be formed, for example, by an ion implantation process and/or a heat treatment. The heat treatment may electrically activate impurities implanted into the source/drain regions 124 during the ion implantation process.

As shown in FIG. 8, each of the gate electrode structures 122 may include first portions 122a disposed on the top surfaces of the active fin structures and second portions 122b vertically spaced apart from portions of the charge trapping layer 116 that are disposed over the bottom surfaces of the trenches 110. That is, the second portions 122b may be disposed on portions of the blocking layer 120 on the field insulating patterns 118, and thus the portions of the charge trapping layer 116 may be spaced apart from the second portions 122b of the gate electrode structure 122 in the trenches 110.

In accordance with example embodiments, the charge trapping layer 116 of the non-volatile memory device may extend along the surfaces of the active fin structures 112 and the bottom surfaces of the trenches 110. As a result, a length of a path along which electrons trapped in the charge trapping layer 116 move may be extended, and the lateral diffusion of the electrons, e.g., the lateral charge diffusion, may be suppressed. Accordingly, although a memory cell adjacent to a programmed memory cell is erased, the lateral diffusion of electrons from the programmed memory cell toward the erased memory cell may be at least partially suppressed.

Figure 11:
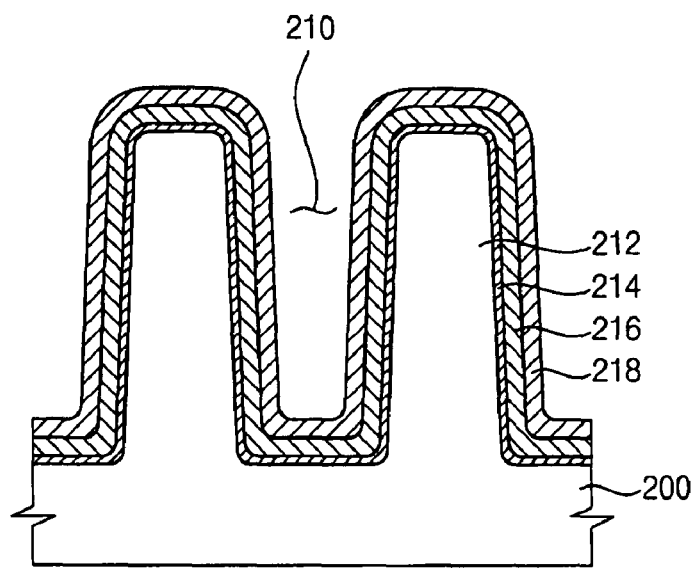
FIGS. 11 and 12 are cross-sectional views illustrating a method of manufacturing a non-volatile memory device in accordance with an example embodiment.
Figure 12:
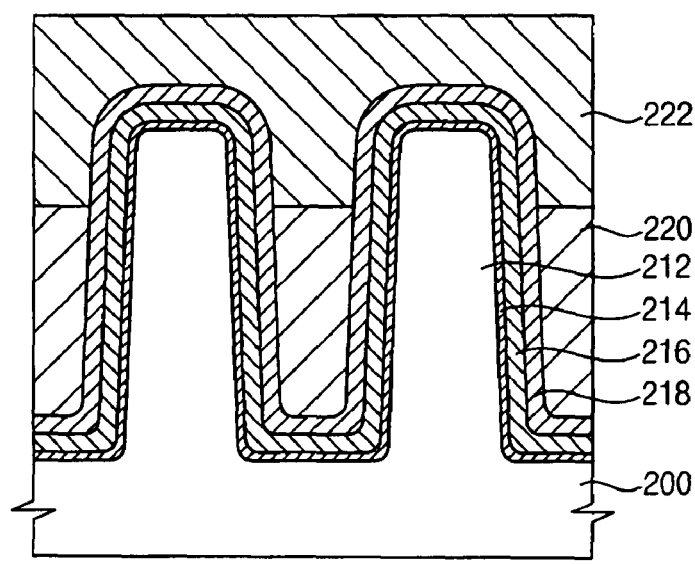

FIGS. 11 and 12 are cross-sectional views illustrating a method of manufacturing a non-volatile memory device according to an example embodiment.

Referring to FIG. 11, trenches 210 may extend in a first direction and may be formed at surface portions of a semiconductor substrate 200, to thereby form active fin structures 212 on the semiconductor substrate 200. Further detailed descriptions of a method of forming the active fin structures 212 will be omitted because these elements may be similar to those already described with reference to FIGS. 3 to 5.

A tunnel insulating layer 214, a charge trapping layer 216 and a blocking layer 218 may be sequentially formed on surfaces of the active fin structures 212 and bottom surfaces of the trenches 210.

The tunnel insulating layer 214 may include silicon oxide and may be formed along the surfaces of the active fin structures 212 and the bottom surfaces of the trenches 210. The charge trapping layer 216 may include, for example, silicon nitride and/or a high-k material and may be formed along the tunnel insulating layer 214. The blocking layer 218 may include, for example, silicon oxide, silicon nitride and/or a high-k material, and may be formed along the charge trapping layer 216. Further detailed descriptions for methods of forming the tunnel insulating layer 214, the charge trapping layer 216 and the blocking layer 218 will be omitted because these elements may be similar to those already described with reference to FIGS. 6 and 8.

Referring to FIG. 12, a field insulating layer may be formed on the blocking layer 218 to fill at least a portion of the trenches 210. The field insulating layer may include, for example, a silicon oxide such as USG, TEOS, HDP-oxide, and the like.

After forming the field insulating layer, an upper portion of the field insulating layer may be removed to expose portions of the blocking layer 218 arranged over upper portions of the active fin structures 212. Consequently, field insulating patterns 220 having upper surfaces disposed lower than top surfaces of the active fin structures 212 may be formed in the trenches 210. The upper portion of the field insulating layer may be removed, for example, by a wet etching process and/or a chemical dry etching (CDE) process.

In an example embodiment, first conductive layer, a barrier layer and a second conductive layer may be formed on the exposed portions of the blocking layer 218 and the field insulating patterns 220. The first conductive layer, the barrier layer and the second conductive layer may be patterned to form gate electrode structures 222, which may extend in a second direction substantially perpendicular to the first direction.

Further detailed descriptions of methods of forming the first conductive layer, the barrier layer and the second conductive layer will be omitted because these elements may be similar to those already described with reference to FIG. 8.

The gate electrode structures 222 may be completed by forming a photoresist pattern on the second conductive layer and performing an etching process using the photoresist pattern as an etching mask. The etching process may be performed to expose surfaces of the upper portions of the active fin structures 112 and the upper surfaces of the field insulating patterns 220. Upper portions of the field insulating patterns 220 may be partially removed during the etching process.

Although not shown in figures, the gate electrode structures 222 may include a first conductive layer pattern, a barrier layer pattern and/or a second conductive layer pattern. The first conductive layer pattern may serve as a gate electrode, and the second conductive layer pattern may serve as a word line.

In accordance with an example embodiment, after forming the gate electrode structures 222, spacers may be formed on the sidewalls of the gate electrode structures 222. The block layer 218, the charge trapping layer 216 and the tunnel insulating layer 214 may be patterned by an etching process using the spacers and the gate electrode structures 222 as etch masks so as to form gate structures.

Source/drain regions may be formed at top surface portions of the active fin structures 212 adjacent to the gate electrode structures 222, forming a non-volatile memory device on the semiconductor substrate 200.

Figure 13:
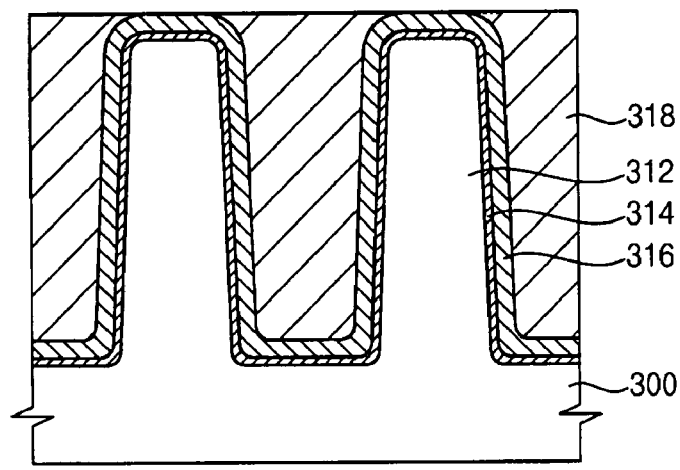
FIGS. 13 and 14 are cross-sectional views illustrating a method of manufacturing a non-volatile memory device in accordance with an example embodiment.
Figure 14:
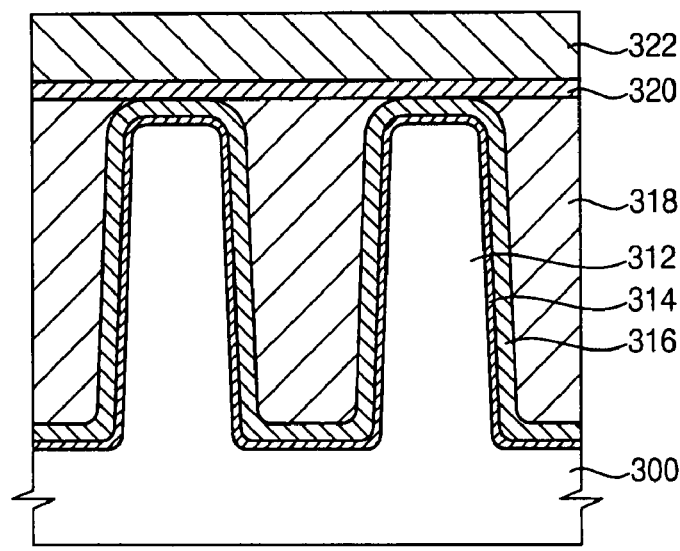

FIGS. 13 and 14 are cross-sectional views illustrating a method of manufacturing a non-volatile memory device according to an example embodiment.

Referring to FIG. 13, trenches may extend in a first direction and may be formed at surface portions of a semiconductor substrate 300, to thereby form active fin structures 312 on the semiconductor substrate 300. Further detailed descriptions of a method of forming the active fin structures 312 will be omitted because these elements may be similar to those already described with reference to FIGS. 3 to 5.

A tunnel insulating layer 314 and a charge trapping layer 316 may be sequentially formed on surfaces of the active fin structures 312 and bottom surfaces of the trenches. The tunnel insulating layer 314 may include, for example, silicon oxide and may be formed along the surfaces of the active fin structures 312 and the bottom surfaces of the trenches. The charge trapping layer 316 may include, for example, silicon nitride and/or a high-k material, and may be continuously formed on the tunnel insulating layer 314. Further detailed descriptions of methods of forming the tunnel insulating layer 314 and the charge trapping layer 316 will be omitted because these elements may be similar to those already described with reference to FIG. 6.

A field insulating layer may be formed on the charge trapping layer 316 to fill at least a portion of the trenches. The field insulating layer may include silicon oxide such as USG, TEOS, HDP-oxide, and the like.

After forming the field insulating layer, an upper portion of the field insulating layer may be removed to expose portions of the charge trapping layer 316 arranged over top surfaces of the active fin structures 312. The upper portion of the field insulating layer may be removed, for example, by a chemical mechanical polishing (CMP) process and/or an etch-back process. Alternatively, a CMP process may be performed to planarize the field insulating layer, and an etch-back process may be subsequently performed. As shown in FIG. 13, the upper portion of the field insulating layer may be removed to expose upper surfaces of the charge trapping layer 316. Consequently, field insulating patterns 318 may be formed in the trenches. The field insulating patterns 318 may have upper surfaces at substantially the same height as the exposed upper surfaces of the charge trapping layer 316, which are arranged over the top surfaces of the active fin structures 312.

Referring to FIG. 14, a blocking layer 320 may be formed on the exposed upper surfaces of the charge trapping layer 316 and the field insulating patterns 318. The blocking layer 320 may include, for example, silicon oxide, silicon nitride and/or a high-k material. Further detailed descriptions of a method of forming the blocking layer 320 will be omitted because the blocking layer 320 may be similar to that already described with reference to FIG. 8.

A first conductive layer, a barrier layer and/or a second conductive layer may be formed on the blocking layer 320. The first conductive layer, the barrier layer and/or the second conductive layer may be patterned to form gate electrode structures 322, which may extend in a second direction substantially perpendicular to the first direction.

Further detailed descriptions of methods of forming the first conductive layer, the barrier layer and the second conductive layer will be omitted because these elements may be similar to those already described with reference to FIG. 8.

The gate electrode structures 322 may be completed by forming a photoresist pattern on the second conductive layer and performing an etching process using the photoresist pattern as an etching mask. The etching process may be performed until the top surfaces of the active fin structures 312 are exposed. Upper portions of the field insulating patterns 318 may be partially removed during the etching process.

Although not shown in figures, the gate electrode structures 322 may include a first conductive layer pattern, a barrier layer pattern and/or a second conductive layer pattern. The first conductive layer pattern may serve as a gate electrode, and the second conductive layer pattern may serve as a word line.

In accordance with an example embodiment, after forming the gate electrode structures 322, spacers may be formed on the sidewalls of the gate electrode structures 322. The block layer 320, the charge trapping layer 316 and the tunnel insulating layer 314 may be patterned by an etching process using the spacers and the gate electrode structures 322 as etch masks so as to form gate structures.

Source/drain regions may be formed at top surface portions of the active fin structures 312 adjacent to the gate electrode structures 322 to thereby form a non-volatile memory device on the semiconductor substrate 300.

Figure 15:
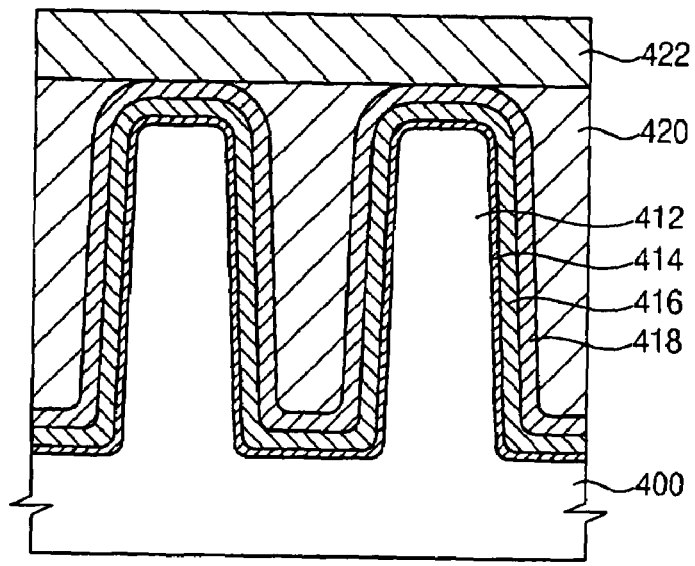
FIG. 15 is a cross-sectional view illustrating a method of manufacturing a non-volatile memory device in accordance with an example embodiment.

FIG. 15 is a cross-sectional view illustrating an example method of manufacturing a non-volatile memory device according to an example embodiment.

Referring to FIG. 15, trenches may extend in a first direction and may be formed at surface portions of a semiconductor substrate 400 to thereby form active fin structures 412 on the semiconductor substrate 400. Further detailed descriptions of a method of forming the active fin structures 412 will be omitted because these elements may be similar to those already described with reference to FIGS. 3 to 5.

A tunnel insulating layer 414, a charge trapping layer 416 and a blocking layer 418 may be sequentially formed on surfaces of the active fin structures 412 and bottom surfaces of the trenches. The tunnel insulating layer 414 may include, for example, silicon oxide and may be formed along the surfaces of the active fin structures 412 and the bottom surfaces of the trenches. The charge trapping layer 416 may include, for example, silicon nitride and/or a high-k material and may be formed along the tunnel insulating layer 414. The blocking layer 418 may include, for example, silicon oxide, silicon nitride and/or a high-k material and may be continuously formed along the charge trapping layer 416. Further detailed descriptions of methods of forming the tunnel insulating layer 414, the charge trapping layer 416 and the blocking layer 418 will be omitted because these elements may be similar to those already described with reference to FIGS. 6 and 8.

A field insulating layer may be formed on the blocking layer 418 to fill at least a portion of the trenches. The field insulating layer may include silicon oxide such as USG, TEOS, HDP-oxide, and the like.

After forming the field insulating layer, an upper portion of the field insulating layer may be removed to expose portions of the blocking layer 418 arranged over top surfaces of the active fin structures 412. The upper portion of the field insulating layer may be removed by a CMP process or an etch-back process, for example. Alternatively, a CMP process may be performed to planarize the field insulating layer, and an etch-back process may be subsequently performed. As shown in FIG. 13, the upper portion of the field insulating layer may be removed to expose upper surfaces of the blocking layer 418. Consequently, field insulating patterns 420 may be formed in the trenches. The field insulating patterns 420 may have upper surfaces at substantially the same height as the exposed upper surfaces of the blocking layer 418, which are arranged over the top surfaces of the active fin structures 412.

A first conductive layer, a barrier layer and/or a second conductive layer may be formed on the exposed portions of the blocking layer 418 and the field insulating patterns 420. The first conductive layer, the barrier layer and the second conductive layer may be patterned to form gate electrode structures 422, which may extend in a second direction substantially perpendicular to the first direction.

Further detailed descriptions of methods of forming the first conductive layer, the barrier layer and/or the second conductive layer will be omitted because these elements may be similar to those already described with reference to FIG. 8.

The gate electrode structures 422 may be completed by forming a photoresist pattern on the second conductive layer and performing an etching process using the photoresist pattern as an etching mask. The etching process may be performed to expose the top surfaces of the active fin structures 412. Upper portions of the field insulating patterns 420 may be partially removed during the etching process.

Although not shown in figures, the gate electrode structures 422 may include a first conductive layer pattern, a barrier layer pattern and/or a second conductive layer pattern. The first conductive layer pattern may serve as a gate electrode, and the second conductive layer pattern may serve as a word line.

In accordance with an example embodiment, after forming the gate electrode structures 422, spacers may be formed on the sidewalls of the gate electrode structures 422. The block layer 418, the charge trapping layer 416 and the tunnel insulating layer 414 may be patterned by an etching process using the spacers and the gate electrode structures 422 as etch masks so as to form gate structures.

Source/drain regions may be formed at top surface portions of the active fin structures 412 adjacent to the gate electrode structures 422, to form a non-volatile memory device on the semiconductor substrate 400.

FIGS. 16 to 19 are cross-sectional views illustrating a method of manufacturing a non-volatile memory device according to an example embodiment.

Figure 16:
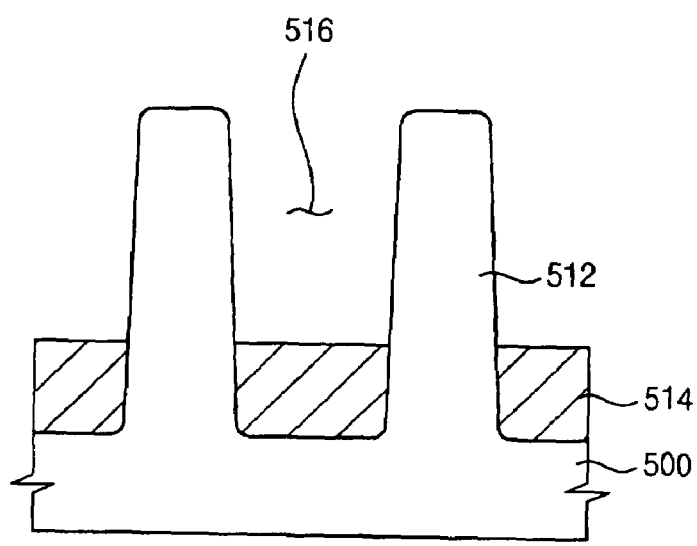
FIGS. 16 to 19 are cross-sectional views illustrating a method of manufacturing a non-volatile memory device in accordance with an example embodiment.

Referring to FIG. 16, first trenches may extend in a first direction and may be formed at surface portions of a semiconductor substrate 500, to form active fin structures 512 on the semiconductor substrate 500. Further detailed descriptions of a method of forming the active fin structures 512 will be omitted because these elements may be similar to those already described with reference to FIGS. 3 to 5.

After forming the first trenches, first field insulating patterns 514 may be formed in the first trenches so as to fill at least lower portions of the first trenches. For example, a first field insulating layer may be formed to fill at least a portion of the first trenches, and an upper portion of the first field insulating layer may then be removed to form the first field insulating patterns 514 in the first trenches.

The first field insulating layer may include USG, TEOS, HDP-oxide, and/or the like, and the upper portion of the first field insulating layer may be removed, for example, by a wet etching process and/or a CDE process. As a result, second trenches 516, which may be defined by sidewalls of the active fin structures 512 and upper surfaces of the first field insulating patterns 514, may be formed on the semiconductor substrate 500.

Figure 17:
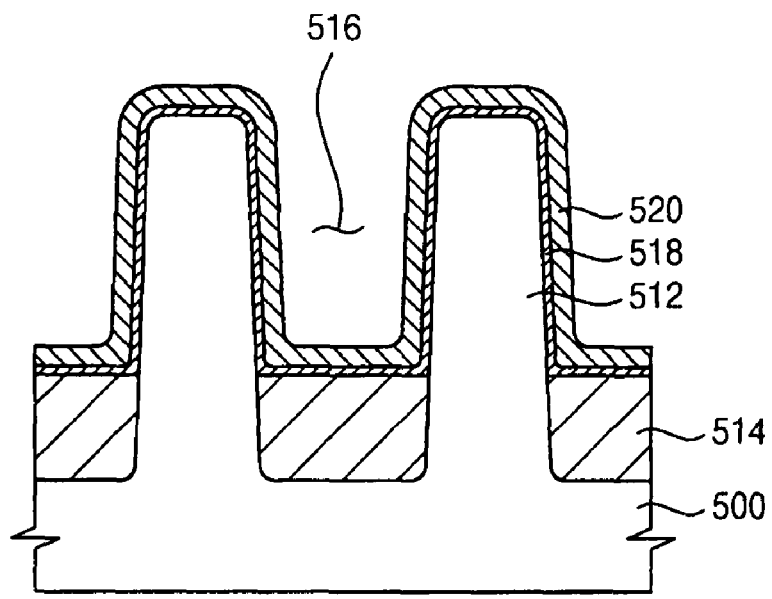

Referring to FIG. 17, a tunnel insulating layer 518 may be formed on surfaces of the active fin structures 512 and the upper surfaces of the first field insulating patterns 514, e.g., bottom surfaces of the second trenches 516. The tunnel insulating layer 518 may be formed, for example, by a thermal oxidation process and/or a CVD process.

A charge trapping layer 520 may be formed on the tunnel insulating layer 518. The charge trapping layer 520 may include, for example, silicon nitride and/or a high-k material.

Further detailed descriptions of methods of forming the tunnel insulating layer 518 and the charge trapping layer 520 will be omitted because these elements may be similar to those already described with reference to FIG. 6.

Figure 18:
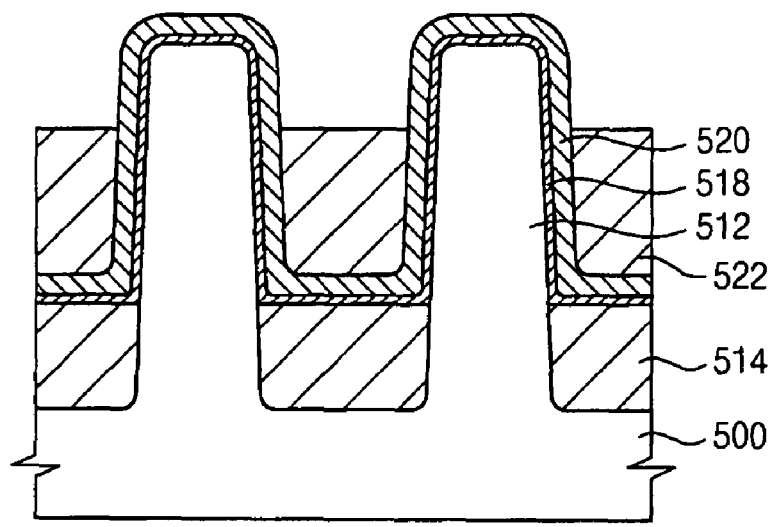

Referring to FIG. 18, a second field insulating layer may be formed on the charge trapping layer 520 to fill at least a portion of the second trenches 516. The second field insulating layer may include, for example, silicon oxide such as USG, TEOS, HDP-oxide, and/or the like.

After the second field insulating layer is formed, an upper portion of the second field insulating layer may be removed to expose portions of the charge trapping layer 520 arranged over upper portions of the active fin structures 512. Second field insulating patterns 522, which may have upper surfaces disposed lower than top surfaces of the active fin structures 512, may be formed in the second trenches 516. The upper portion of the second field insulating layer may be removed, for example, by a wet etching process and/or a chemical dry etching (CDE) process.

Figure 19:
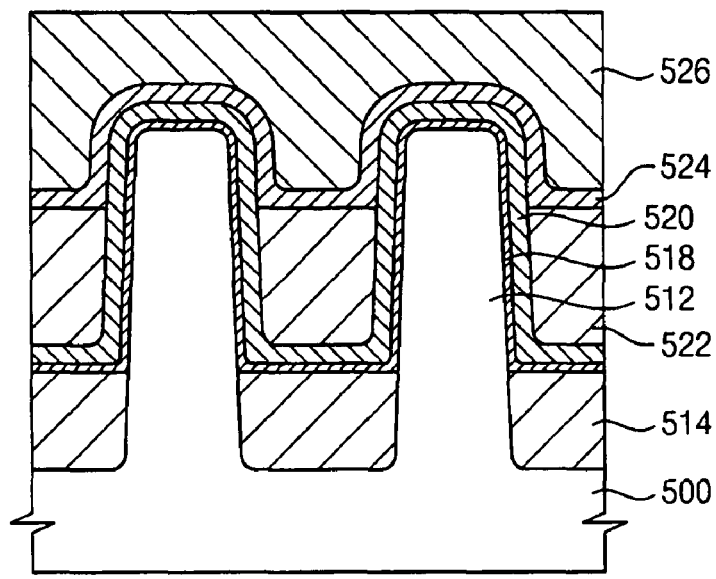

Referring to FIG. 19, a blocking layer 524 may be formed on the exposed portions of the charge trapping layer 520 and the second field insulating patterns 522. The blocking layer 524 may include, for example, silicon oxide, silicon oxynitride and/or a high-k material. Further detailed descriptions of a method of forming the blocking layer 524 will be omitted because the blocking layer 524 may be similar to that already described with reference to FIG. 8.

A first conductive layer, a barrier layer and/or a second conductive layer may be formed on the blocking layer 524. The first conductive layer, the barrier layer and/or the second conductive layer may be patterned to form gate electrode structures 526, which may extend in a second direction substantially perpendicular to the first direction.

Further detailed descriptions of methods of forming the first conductive layer, the barrier layer and the second conductive layer will be omitted because these elements may be similar to those already described with reference to FIG. 8.

The gate electrode structures 526 may be completed by forming a photoresist pattern on the second conductive layer and performing an etching process using the photoresist pattern as an etching mask. The etching process may be performed to expose surfaces of the upper portions of the active fin structures 512 and the upper surfaces of the second field insulating patterns 522. Upper portions of the second field insulating patterns 522 may be partially removed during the etching process.

Although not shown in figures, the gate electrode structures 526 may include a first conductive layer pattern, a barrier layer pattern and/or a second conductive layer pattern. The first conductive layer pattern may serve as a gate electrode, and the second conductive layer pattern may serve as a word line.

In accordance with an example embodiment, after forming the gate electrode structures 526, spacers may be formed on sidewalls of the gate electrode structures 526. The block layer 524, the charge trapping layer 520 and/or the tunnel insulating layer 518 may be patterned by an etching process using the spacers and the gate electrode structures 526 as etch masks so as to form gate structures.

Source/drain regions may be formed at top surface portions of the active fin structures 512 adjacent to the gate electrode structures 526, to thereby form a non-volatile memory device on the semiconductor substrate 500.

In accordance with example embodiments, the first trenches may be filled by the first and second field insulating patterns 514 and 522. Voids or seams may thus be prevented from being formed in the first trenches.

Figure 20:
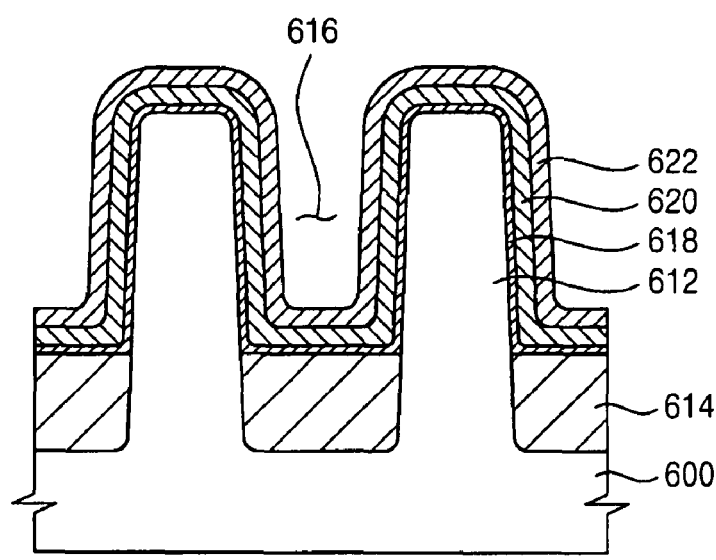
FIGS. 20 and 21 are cross-sectional views illustrating a method of manufacturing a non-volatile memory device in accordance with an example embodiment.
Figure 21:
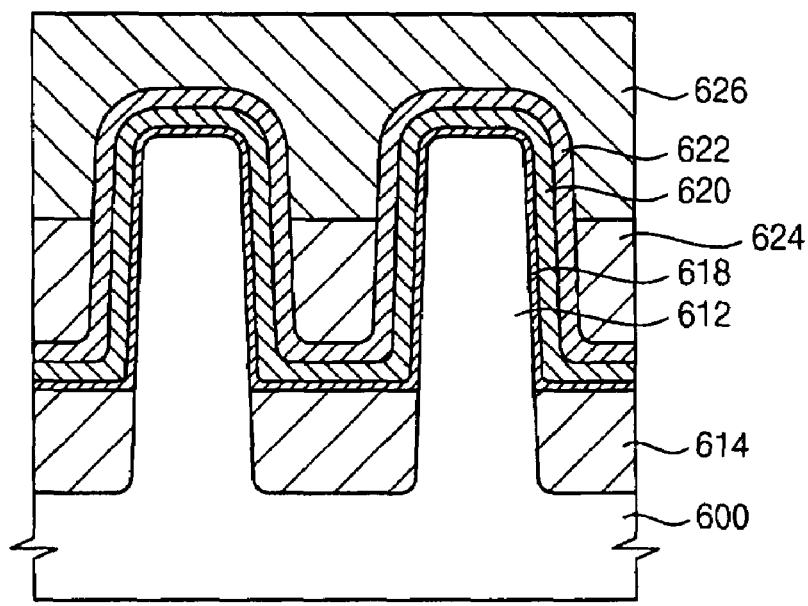

FIGS. 20 and 21 are cross-sectional views illustrating a method of manufacturing a non-volatile memory device according to an example embodiment.

Referring to FIG. 20, first trenches may extend in a first direction and may be formed at surface portions of a semiconductor substrate 600, to form active fin structures 612 on the semiconductor substrate 600. Further detailed descriptions of a method of forming the active fin structures 612 will be omitted because these elements may be similar to those already described with reference to FIGS. 3 to 5.

After forming the first trenches, first field insulating patterns 614 may be formed in the first trenches so as to fill at least lower portions of the first trenches. For example, a first field insulating layer may be formed to fill at least a portion of the first trenches, and an upper portion of the first field insulating layer may then be removed to form the first field insulating patterns 614 in the first trenches.

The first field insulating layer may include, for example, USG, TEOS, HDP-oxide, etc., and the upper portion of the first field insulating layer may be removed by a wet etching process and/or a CDE process. As a result, second trenches 616, which may be defined by sidewalls of the active fin structures 612 and upper surfaces of the first field insulating patterns 614, may be formed on the semiconductor substrate 600.

A tunnel insulating layer 618 may be formed on surfaces of the active fin structures 612 and the upper surfaces of the first field insulating patterns 614, and/or bottom surfaces of the second trenches 616. The tunnel insulating layer 618 may be formed by a thermal oxidation process and/or a CVD process, for example.

A charge trapping layer 620 may be continuously formed on the tunnel insulating layer 618. The charge trapping layer 620 may include silicon nitride and/or a high-k material, for example.

A blocking layer 622 may be formed on the charge trapping layer 620. The blocking layer 622 may include, for example, silicon oxide, silicon nitride and/or a high-k material.

Further detailed descriptions of methods of forming the tunnel insulating layer 618, the charge trapping layer 620 and the blocking layer 622 will be omitted because these elements may be similar to those already described with reference to FIGS. 6 and 8.

Referring to FIG. 21, a second field insulating layer may be formed on the blocking layer 622 to fill at least a portion of the second trenches 616. The second field insulating layer may include, for example, silicon oxide such as USG, TEOS, HDP-oxide, and the like.

After forming the second field insulating layer, an upper portion of the second field insulating layer may be removed to expose portions of the blocking layer 622 arranged over upper portions of the active fin structures 612. Consequently, second field insulating patterns 624, having upper surfaces disposed lower than top surfaces of the active fin structures 612, may be formed in the second trenches 616. The upper portion of the second field insulating layer may be removed, for example, by a wet etching process and/or a CDE process.

A first conductive layer, a barrier layer and/or a second conductive layer may be formed on the exposed portions of the blocking layer 622 and the second field insulating patterns 624. The first conductive layer, the barrier layer and/or the second conductive layer may be patterned to form gate electrode structures 626, which may extend in a second direction substantially perpendicular to the first direction.

Further detailed descriptions of methods of forming the first conductive layer, the barrier layer and the second conductive layer will be omitted because these elements may be similar to those already described with reference to FIG. 8.

The gate electrode structures 626 may be completed by forming a photoresist pattern on the second conductive layer and performing an etching process using the photoresist pattern as an etching mask. The etching process may be performed to expose surfaces of the upper portions of the active fin structures 612 and the upper surfaces of the second field insulating patterns 624 are exposed. Upper portions of the second field insulating patterns 624 may be partially removed during the etching process.

Although not shown in figures, the gate electrode structures 626 may include a first conductive layer pattern, a barrier layer pattern and/or a second conductive layer pattern. The first conductive layer pattern may serve as a gate electrode, and the second conductive layer pattern may serve as a word line.

In accordance with example embodiments, after forming the gate electrode structures 626, spacers may be formed on sidewalls of the gate electrode structures 626. The block layer 622, the charge trapping layer 620 and the tunnel insulating layer 618 may be patterned by an etching process using the spacers and the gate electrode structures 626 as etch masks so as to form gate structures.

Source/drain regions may be formed at top surface portions of the active fin structures 612 adjacent to the gate electrode structures 626, to thereby form a non-volatile memory device on the semiconductor substrate 600.

Figure 22:
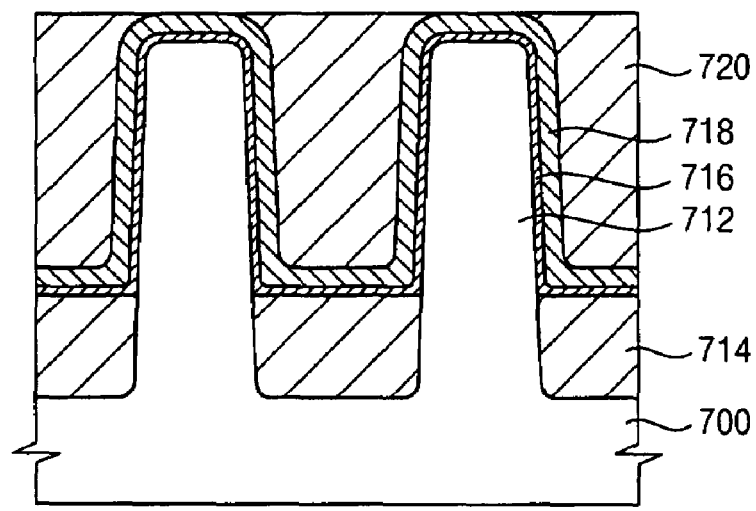
FIGS. 22 and 23 are cross-sectional views illustrating a method of manufacturing a non-volatile memory device in accordance with an example embodiment.
Figure 23:
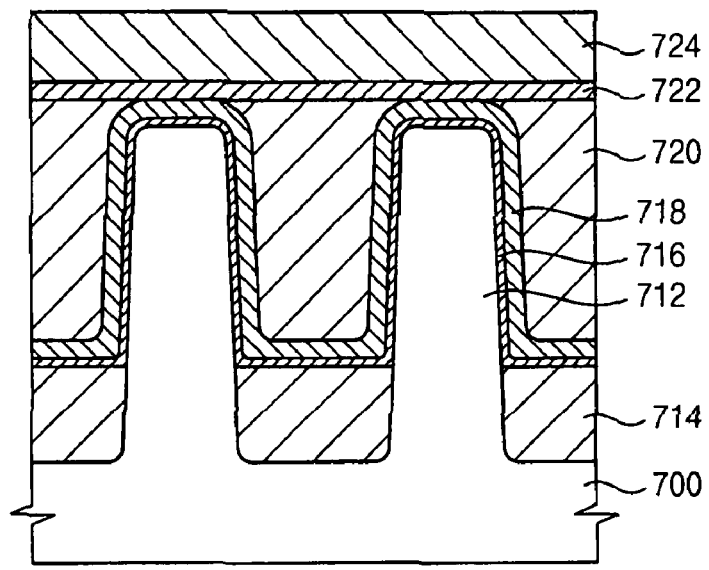

FIGS. 22 and 23 are cross-sectional views illustrating a method of manufacturing a non-volatile memory device according to an example embodiment.

Referring to FIG. 22, first trenches may extend in a first direction and may be formed at surface portions of a semiconductor substrate 700, to form active fin structures 712 on the semiconductor substrate 700. Further detailed descriptions of a method of forming the active fin structures 712 will be omitted because these elements may be similar to those already described with reference to FIGS. 3 to 5.

After forming the first trenches, first field insulating patterns 714 may be formed in the first trenches so as to fill at least lower portions of the first trenches. For example, a first field insulating layer may be formed to fill at least a portion of the first trenches, and an upper portion of the first field insulating layer may then be removed to form the first field insulating patterns 714 in the first trenches.

The first field insulating layer may include, for example, USG, TEOS, HDP-oxide, etc., and the upper portion of the first field insulating layer may be removed by a wet etching process and/or a chemical dry etching (CDE) process. As a result, second trenches, which may be defined by sidewalls of the active fin structures 712 and upper surfaces of the first field insulating patterns 714, may be formed on the semiconductor substrate 700.

A tunnel insulating layer 716 may be formed on surfaces of the active fin structures 712 and the upper surfaces of the first field insulating patterns 714, and/or the bottom surfaces of the second trenches. The tunnel insulating layer 716 may be formed, for example, by a thermal oxidation process and/or a chemical vapor deposition (CVD) process.

A charge trapping layer 718 may be formed on the tunnel insulating layer 716. The charge trapping layer 718 may include, for example, silicon nitride and/or a high-k material.

Further detailed descriptions of methods of forming the tunnel insulating layer 716 and the charge trapping layer 718 will be omitted because these elements may be similar to those already described with reference to FIG. 6.

A second field insulating layer may be formed on the charge trapping layer 718 to fill at least a portion of the second trenches. The second field insulating layer may include, for example, silicon oxide such as USG, TEOS, HDP-oxide, and the like.

After forming the second field insulating layer, an upper portion of the second field insulating layer may be removed to expose portions of the charge trapping layer 718 arranged over top surfaces of the active fin structures 712. The upper portion of the second field insulating layer may be removed, for example, by a chemical mechanical polishing (CMP) process and/or an etch-back process. Alternatively, a CMP process may be performed to planarize the second field insulating layer and an etch-back process may be subsequently performed. As shown in FIG. 22, the upper portion of the second field insulating layer may be removed to expose upper surfaces of the charge trapping layer 718 to form second field insulating patterns 720 may be formed in the second trenches. The second field insulating patterns 720 may have upper surfaces substantially at the same height as the exposed upper surfaces of the charge trapping layer 718, which may be arranged over the top surfaces of the active fin structures 712.

Referring to FIG. 23, a blocking layer 722 may be formed on the exposed upper surfaces of the charge trapping layer 718 and the second field insulating patterns 720. The blocking layer 722 may include, for example, silicon oxide, silicon nitride and/or a high-k material. Further detailed descriptions of a method of forming the blocking layer 722 will be omitted because the blocking layer 722 may be similar to that already described with reference to FIG. 8.

A first conductive layer, a barrier layer and/or a second conductive layer may be formed on the blocking layer 722. The first conductive layer, the barrier layer and/or the second conductive layer may be patterned to form gate electrode structures 724, which may extend in a second direction substantially perpendicular to the first direction.

Further detailed descriptions of methods of forming the first conductive layer, the barrier layer and/or the second conductive layer will be omitted because these elements may be similar to those already described with reference to FIG. 8.

The gate electrode structures 724 may be completed by forming a photoresist pattern on the second conductive layer and performing an etching process using the photoresist pattern as an etching mask. The etching process may be performed to expose the top surfaces of the active fin structures 712. Upper portions of the second field insulating patterns 720 may be partially removed during the etching process.

Although not shown in figures, the gate electrode structures 724 may include a first conductive layer pattern, a barrier layer pattern and/or a second conductive layer pattern. The first conductive layer pattern may serve as a gate electrode and the second conductive layer pattern may serve as a word line.

In accordance with another example embodiment, after forming the gate electrode structures 724, spacers may be formed on sidewalls of the gate electrode structures 724. The block layer 722, the charge trapping layer 718 and the tunnel insulating layer 716 may be patterned by an etching process using the spacers and the gate electrode structures 724 as etch masks so as to form gate structures.

Source/drain regions may be formed at top surface portions of the active fin structures 712 adjacent to the gate electrode structures 724 to thereby form a non-volatile memory device on the semiconductor substrate 700.

Figure 24:
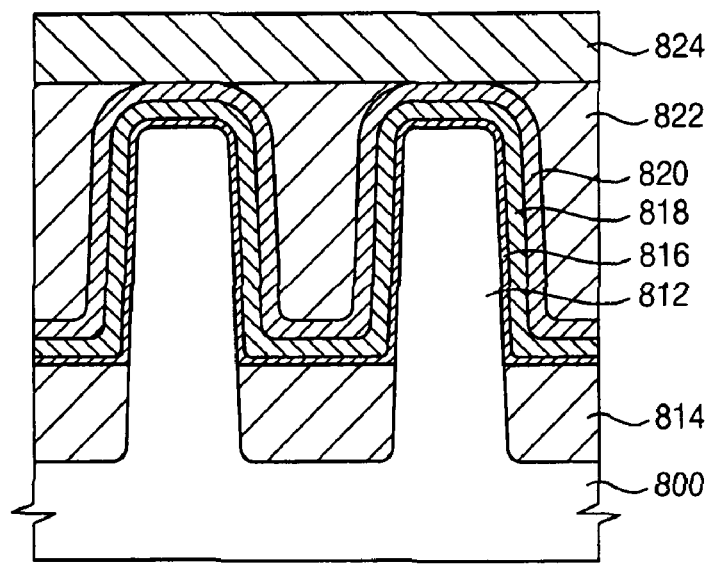
FIG. 24 is a cross-sectional view illustrating a method of manufacturing a non-volatile memory device in accordance with an example embodiment.

FIG. 24 is a cross-sectional view illustrating a method of manufacturing a non-volatile memory device according to an example embodiment.

Referring to FIG. 24, first trenches may extend in a first direction and may be formed at surface portions of a semiconductor substrate 800, to thereby form active fin structures 812 on the semiconductor substrate 800. Further detailed descriptions of a method of forming the active fin structures 812 will be omitted because these elements may be similar to those already described with reference to FIGS. 3 to 5.

After forming the first trenches, first field insulating patterns 814 may be formed in the first trenches so as to fill at least lower portions of the first trenches. For example, a first field insulating layer may be formed to fill at least a portion of the first trenches, and an upper portion of the first field insulating layer may be removed to form the first field insulating patterns 814 in the first trenches.

The first field insulating layer may include, for example, USG, TEOS, HDP-oxide, and the like, and the upper portion of the first field insulating layer may be removed by a wet etching process and/or a chemical dry etching (CDE) process. As a result, second trenches, which may be defined by the sidewalls of the active fin structures 812 and the upper surfaces of the first field insulating patterns 814, may be formed on the semiconductor substrate 800.

A tunnel insulating layer 816 may be formed on surfaces of the active fin structures 812 and the upper surfaces of the first field insulating patterns 814 and/or the bottom surfaces of the second trenches. The tunnel insulating layer 816 may be formed, for example, by a thermal oxidation process and/or a chemical vapor deposition (CVD) process.

A charge trapping layer 818 may be formed on the tunnel insulating layer 816. The charge trapping layer 818 may include silicon nitride and/or a high-k material, for example.

A blocking layer 820 may be formed on the charge trapping layer 818. The blocking layer 820 may include, for example, silicon oxide, silicon nitride and/or a high-k material.

Further detailed descriptions of methods of forming the tunnel insulating layer 816, the charge trapping layer 818 and the blocking layer 820 will be omitted because these elements may be similar to those already described with reference to FIGS. 6 and 8.

A second field insulating layer may be formed on the blocking layer 820 to fill at least a portion of the second trenches. The second field insulating layer may include, for example, silicon oxide such as USG, TEOS, HDP-oxide, and/or the like.

After forming the second field insulating layer, an upper portion of the second field insulating layer may be removed to expose portions of the blocking layer 820 arranged over top surfaces of the active fin structures 812. The upper portion of the second field insulating layer may be removed, for example, by a chemical mechanical polishing (CMP) process and/or an etch-back process. Alternatively, a CMP process may be performed to planarize the second field insulating layer, and an etch-back process may be subsequently performed. As shown in FIG. 24, the upper portion of the second field insulating layer may be removed to expose upper surfaces of the blocking layer 820 to form second field insulating patterns 822 may be formed in the second trenches. The second field insulating patterns 822 may have upper surfaces substantially at the same height as the exposed upper surfaces of the blocking layer 820, which are arranged over the top surfaces of the active fin structures 812.

A first conductive layer, a barrier layer and/or a second conductive layer may be formed on the exposed upper surfaces of the blocking layer 820 and the second field insulating patterns 822. The first conductive layer, the barrier layer and the second conductive layer may be patterned to form gate electrode structures 824, which may extend in a second direction substantially perpendicular to the first direction.

Further detailed descriptions of methods of forming the first conductive layer, the barrier layer and the second conductive layer will be omitted because these elements may be similar to those already described with reference to FIG. 8.

The gate electrode structures 824 may be completed by forming a photoresist pattern on the second conductive layer and performing an etching process using the photoresist pattern as an etching mask. The etching process may be performed to expose the top surfaces of the active fin structures 812. Upper portions of the second field insulating patterns 822 may be partially removed during the etching process.

Although not shown in figures, the gate electrode structures 824 may include a first conductive layer pattern, a barrier layer pattern and a second conductive layer pattern. The first conductive layer pattern may serve as a gate electrode, and the second conductive layer pattern may serve as a word line.

In accordance with example embodiments, after forming the gate electrode structures 824, spacers may be formed on sidewalls of the gate electrode structures 824. The block layer 820, the charge trapping layer 818 and the tunnel insulating layer 816 may be patterned by an etching process using the spacers and the gate electrode structures 824 as etch masks so as to form gate structures.

Source/drain regions may be formed at the top surface portions of the active fin structures 812 adjacent to the gate electrode structures 824, to thereby form a non-volatile memory device on the semiconductor substrate 800.

In accordance with example embodiments as described above, a length of the charge trapping layer may be extended in an extending direction of the word line, e.g., the second direction. Thus, the lateral diffusion of electrons may be reduced in the charge trapping layer, thereby improving the data retention performance and/or reliability of the non-volatile memory device.

Although example embodiments have been described, it is understood that the example embodiments should not be limited to these example embodiments but various changes and modifications can be made by those skilled in the art within the spirit and scope of the example embodiments as hereinafter claimed.

What is claimed is:

1. A non-volatile memory device, comprising:
   at least one active fin structure extending in a first direction on a substrate;
   an insulating layer on a surface of the at least one active fin structure and on a bottom surface of a trench defined by the at least one active fin structure;
   a charge trapping layer on an entirety of the insulating layer;
   at least one field insulating pattern on the charge trapping layer in the trench;
   a blocking layer on the at least one field insulating pattern; and
   a gate electrode structure including first portions over top surfaces of the at least one active fin structure and second portions vertically spaced apart from portions of the charge trapping layer that are over the bottom surface of the trench, the gate electrode structure extending in a second direction substantially perpendicular to the first direction.

2. The non-volatile memory device of claim 1, wherein the at least one field insulating pattern is between the charge trapping layer and the second portions of the gate electrode structure.

3. The non-volatile memory device of claim 2, wherein upper surface of the at least one field insulating pattern is lower than the top surfaces of the at least one active fin structure.

4. The non-volatile memory device of claim 3, wherein the blocking layer is on portions of the charge trapping layer that are over side surfaces of the at least one active fin structure.

5. The non-volatile memory device of claim 3, wherein the blocking layer is formed over an entire surface of the charge trapping layer.

6. The non-volatile memory device of claim 2, wherein upper surface of the at least one field insulating pattern is are substantially at a same height as portions of the charge trapping layer that are over the top surfaces of the at least one active fin structure.

7. The non-volatile memory device of claim 6, wherein the blocking layer is on the at least one field insulating pattern and the portions of the charge trapping layer that are over the top surfaces of the at least one active fin structure.

8. The non-volatile memory device of claim 2, wherein the blocking layer is over an entire surface of the charge trapping layer.

9. The non-volatile memory device of claim 1, further comprising a first field insulating pattern in the trench.

10. The non-volatile memory device of claim 9, further comprising a second field insulating pattern between the charge trapping layer and the second portions of the gate electrode structure.

11. The non-volatile memory device of claim 10, wherein upper surfaces of the second field insulating pattern is lower than the top surfaces of the at least one active fin structure.

12. The non-volatile memory device of claim 11, wherein the blocking layer is on portions of the charge trapping layer that are over surfaces of the at least one active fin structure.

13. The non-volatile memory device of claim 11, wherein the blocking layer is over an entire surface of the charge trapping layer.

14. The non-volatile memory device of claim 10, wherein an upper surface of the second field insulating pattern is substantially at a same height as those of upper surfaces of portions of the charge trapping layer that are over the top surfaces of the at least one active fin structure.

15. The non-volatile memory device of claim 14, wherein the blocking layer is on the second field insulating pattern and on portions of the charge trapping layer that are over the top surfaces of the at least one active fin structure.

16. The non-volatile memory device of claim 10, wherein the blocking layer is over an entire surface of the charge trapping layer.

17. A method of manufacturing a non-volatile memory device, comprising:
   forming at least one active fin structure extending in a first direction on a substrate;
   forming an insulating layer on a surface of the at least one active fin structure and on a bottom surface of a trench defined by the at least one active fin structure;
   forming a charge trapping layer on an entirety of the insulating layer;
   forming at least one field insulating pattern on the charge trapping layer in the trench;
   forming a blocking layer on the at least one field insulating pattern; and
   forming a gate electrode structure including first portions over top surfaces of the at least one active fin structure and second portions vertically spaced apart from portions of the charge trapping layer that are over the bottom surface of the trench, the gate electrode structure extending in a second direction substantially perpendicular to the first direction.

18. The method of claim 17, further comprising:
   forming the at least one field insulating pattern between the charge trapping layer and the second portions of the gate electrode structure.

19. The method of claim 18, wherein forming the at least one field insulating pattern comprises:
   forming a field insulating layer in the trench on the substrate after forming the charge trapping layer; and
   etching an upper portion of the field insulating layer to expose portions of the charge trapping layer.

20. The method of claim 19, wherein forming the blocking layer comprises:
   continuously forming the blocking layer on the at least one field insulating pattern and the exposed portions of the charge trapping layer.

21. The method of claim 18, wherein
   forming the at least one field insulating pattern comprises:
   forming a field insulating layer in the trench on the substrate after forming the blocking layer; and
   etching an upper portion of the field insulating layer to expose portions of the blocking layer.

22. The method of claim 17, wherein forming the at least one field insulating pattern comprises:
   forming a field insulating layer in the trench on the substrate after forming the charge trapping layer; and
   etching an upper portion of the field insulating layer to expose upper surfaces of portions of the charge trapping layer that are formed over the top surfaces of the at least one active fin structure.

23. The method of claim 22, wherein forming the blocking layer comprises:
   forming the blocking layer on the at least one field insulating pattern and the exposed upper surfaces of the portions of the charge trapping layer.

24. The method of claim 18, wherein forming the at least one field insulating pattern comprises:
   forming a field insulating layer in the trench on the substrate after forming the blocking layer; and
   etching an upper portion of the field insulating layer to expose upper surfaces of portions of the blocking layer that are formed over the top surfaces of the at least one active fin structure.

25. The method of claim 17, further comprising:
   forming first field insulating pattern on the substrate before forming the charge trapping layer to define the trench by sidewalls of the at least one active structure and upper surface of the first field insulating pattern.

26. The method of claim 25, further comprising:
   forming a second field insulating pattern between the portions of the charge trapping layer that are over the bottom surfaces of the trenches and the second portions of the gate electrode structure.

27. The method of claim 26, wherein forming the second field insulating pattern comprises:
   forming a field insulating layer in the trench on the substrate after forming the charge trapping layer; and
   etching an upper portion of the field insulating layer to expose portions of the charge trapping layer that are formed over surfaces of upper portions of the at least one active fin structure.

28. The method of claim 27, wherein forming the blocking layer comprises continuously forming the blocking layer on the second field insulating pattern and the exposed portions of the charge trapping layer.

29. The method of claim 25, wherein forming the second field insulating pattern comprises:
   forming a field insulating layer in the trench on the substrate after forming the blocking layer; and
   etching an upper portion of the field insulating layer to expose portions of the blocking layer.

30. The method of claim 25, wherein forming the second field insulating pattern comprises:
   forming a field insulating layer in the trench on the substrate after forming the charge trapping layer; and
   etching an upper portion of the field insulating layer to expose upper surfaces of portions of the charge trapping layer that are formed over the top surfaces of the at least one active fin structure.

31. The method of claim 27, wherein forming the blocking layer comprises continuously forming the blocking layer on the second field insulating pattern and the exposed upper surfaces of the portions of the charge trapping layer.

32. The method of claim 26, wherein forming the second field insulating pattern comprises:
   forming a field insulating layer in the trench on the substrate after forming the blocking layer; and
   etching an upper portion of the field insulating layer to expose upper surfaces of portions of the blocking layer that are formed over the top surfaces of the at least one active fin structure.

* * * * *